(12) United States Patent
Tzeng et al.

(10) Patent No.: US 9,008,253 B2
(45) Date of Patent: Apr. 14, 2015

(54) CONTROL METHOD FOR SELECTING FREQUENCY BAND AND RELATED CLOCK DATA RECOVERY DEVICE

(71) Applicant: NOVATEK Microelectronics Corp., Hsin-Chu (TW)

(72) Inventors: Tzu-Chien Tzeng, Hsinchu (TW); Hung-Yi Cheng, New Taipei (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 45 days.

(21) Appl. No.: 13/775,119

(22) Filed: Feb. 23, 2013

(65) Prior Publication Data

US 2014/0112425 A1 Apr. 24, 2014

Related U.S. Application Data

(60) Provisional application No. 61/717,612, filed on Oct. 23, 2012.

(30) Foreign Application Priority Data

Jan. 7, 2013 (TW) .............................. 102100434 A (51) Int. Cl.
*H03D 3/24* (2006.01)
*H04L 7/033* (2006.01)
(Continued)

(52) U.S. Cl.
CPC .............. *H04L 7/0331* (2013.01); *H04L 7/033* (2013.01); *H03L 7/0807* (2013.01); *H03L 7/103* (2013.01); *H03L 7/1072* (2013.01)

(58) Field of Classification Search
USPC ................................................ 375/374, 376
See application file for complete search history.

(56) References Cited

U.S. PATENT DOCUMENTS 7,164,322 B1* 1/2007 Knotts et al. .................. 331/1 A
7,995,698 B2* 8/2011 Liu et al. ...................... 375/376
(Continued)

FOREIGN PATENT DOCUMENTS

TW 200843355 11/2008
TW 201216029 4/2012

OTHER PUBLICATIONS

Walker, R.; Stout, C.; Yen, C.-S."A 2.488 Gb/s Si-bipolar clock and data recovery IC with robust loss of signal detection," 1997 IEEE InternationalSolid-State Circuits Conference, 1997. Digest of Technical Papers. 43rd ISSCC., 1997, pp. 246-247.*
(Continued)

*Primary Examiner* — Shuwang Liu
*Assistant Examiner* — Nader Bolourchi
(74) *Attorney, Agent, or Firm* — Winston Hsu; Scott Margo (57) ABSTRACT

A control method utilized in a clock data recovery device supporting a plurality of frequency bands, for controlling the clock data recovery device to select an operating frequency band from the plurality of frequency bands and to generate a recovery clock for generating retimed data, includes receiving a serial data stream with a data frequency; making each frequency band of the plurality of frequency bands correspond to a plurality of frequency band groups, wherein each frequency band group includes at least one frequency band and corresponds to different frequency ranges; selecting a frequency band group from the plurality of frequency band groups as a coarse-tuned frequency band group according to the data frequency and a locking voltage range; and selecting a frequency band from the plurality of frequency bands according to the data frequency, the locking voltage range and the coarse-tuned frequency band group for generating the recovery clock.

40 Claims, 7 Drawing Sheets

(51) Int. Cl.
*H03L 7/08* (2006.01)
*H03L 7/10* (2006.01)
*H03L 7/107* (2006.01)

(56) References Cited

U.S. PATENT DOCUMENTS

| | | | |
|---|---|---|---|
| 2005/0057290 A1* | 3/2005 | Dalton et al. | 327/156 |
| 2005/0174185 A1* | 8/2005 | Steinbach et al. | 331/179 |
| 2006/0238261 A1* | 10/2006 | Rhee et al. | 331/16 |
| 2010/0026404 A1* | 2/2010 | Hosoya | 331/177 V |
| 2010/0102888 A1* | 4/2010 | Edwards et al. | 331/16 |

OTHER PUBLICATIONS

Meghelli, M.; Rylyakov, A.V.; Zier, S.J.; Sorna, M.; Friedman, D. "A 0.18-μm SiGe BiCMOS receiver and transmitter chipset for SONET OC-768 transmission systems", Solid-State Circuits, IEEE Journal of, On pp. 2147-2154 vol. 38, Issue: 12, Dec. 2003.*

Kishine, K.; Fujimoto, K.; Kusanagi, S.; Ichino, H. "PLL design technique by a loop-trajectory analysis taking decision-circuit phase margin into account for over-10-Gb/s clock and data recovery circuits", Solid-State Circuits, IEEE Journal of, On pp. 740-750 vol. 39, Issue: 5, May 2004.*

Jinwook Kim; Jeongsik Yang; Sangjin Byun; Hyunduk Jun; Jeongkyu Park; Conroy, C.S.G.; Beomsup Kim "A four-channel 3.125-Gb/s/ch CMOS serial-link transceiver with a mixed-mode adaptive equalizer", Solid-State Circuits, IEEE Journal of, On pp. 462-471 vol. 40, Issue: 2, Feb. 2005.*

Redman-White, W.; Bugbee, M.; Dobbs, S.; Xinyan Wu; Balmford, R.; Nuttgens, J.; Kiani, U.S.; Clegg, R.; den Besten, G.W. "A Robust High Speed Serial PHY Architecture With Feed-Forward Correction Clock and Data Recovery", Solid-State Circuits, IEEE Journal of, On pp. 1914-1926 vol. 44, Issue: 7, Jul. 2009.*

Nielsen, S.; Yen, J.C.; Srivastava, N.K.; Rogers, J.E.; Case, M.G.; Thiagarajah, R. "A fully integrated 43.2-Gb/s clock and data recovery and 1:4 demux IC in InP HBT technology", Solid-State Circuits, IEEE Journal of, On pp. 2341-2346 vol. 38, Issue: 12, Dec. 2003.*

Walker, A 2.488Gbps Si-bipolar clock and data recovery IC with robust loss of signal detection. FP15.5, 1997.

* cited by examiner

CONTROL METHOD FOR SELECTING FREQUENCY BAND AND RELATED CLOCK DATA RECOVERY DEVICE

CROSS REFERENCE TO RELATED APPLICATIONS

This application claims the benefit of U.S. Provisional Application No. 61/717,612, filed on 2012 Oct. 23 and entitled "Frequency Acquisition Method for Clock and data Recovery circuit", the contents of which are incorporated herein in their entirety.

BACKGROUND OF THE INVENTION

1. Field of the Invention

The present invention relates to a control method and clock data recovery device thereof for generating a recovery clock, and more particularly, to a control method and clock data recovery device thereof capable of generating an accurate recovery clock without using an accurate reference clock.

2. Description of the Prior Art

In an electronic system, clock signals between a transmitting end and a receiving end inherently have a clock skew. The electronic system needs to utilize a clock data recovery circuit for compensating the clock skew between the clock signals, so as to correctly acquire transmission data at the receiving end. The clock data recovery circuit needs an accurate reference clock for precisely compensating the clock skew.

Figure 1:
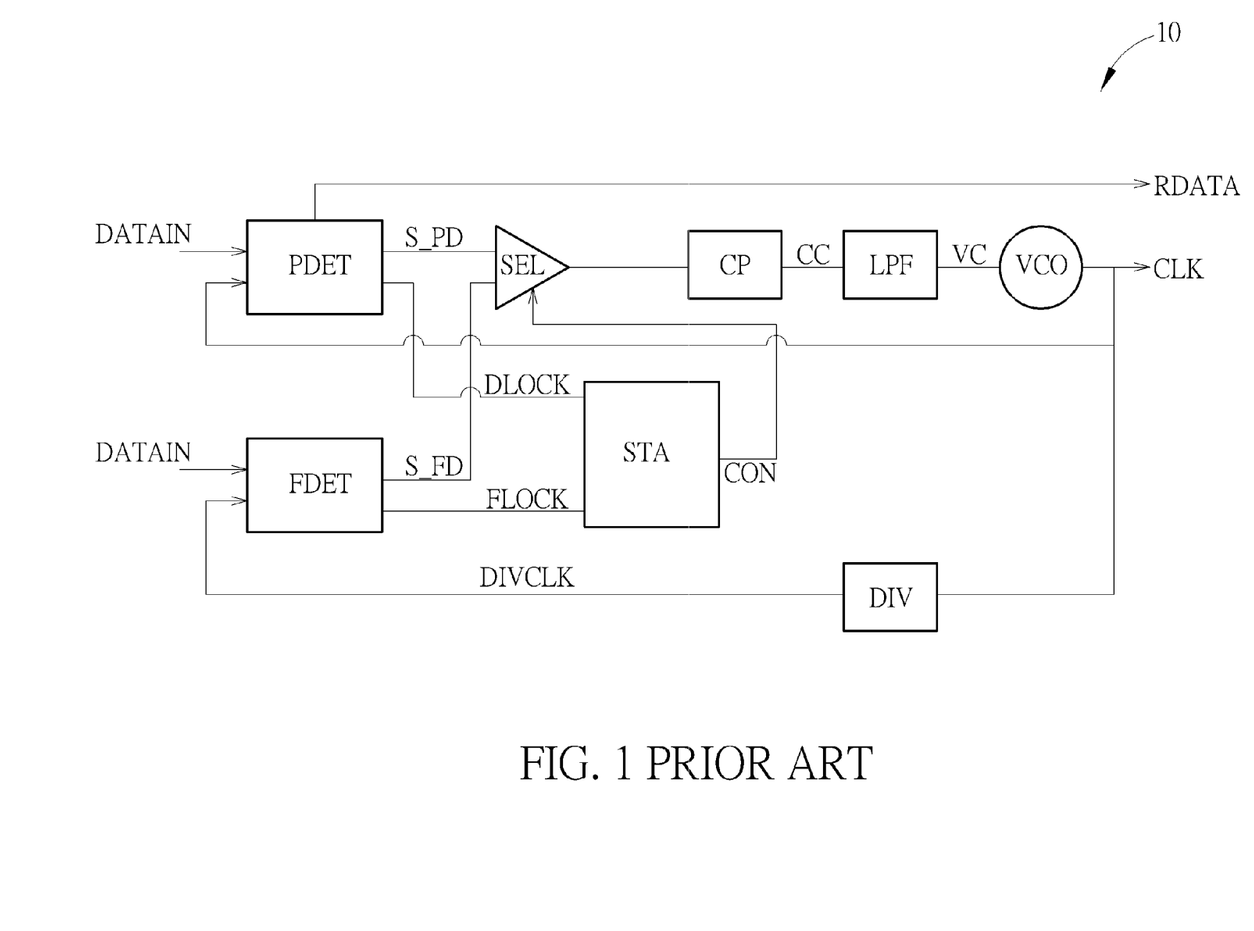
FIG. 1 is a schematic diagram of a conventional clock data recovery device.

Please refer to FIG. 1, which is a schematic diagram of a conventional clock data recovery device 10. The clock data recovery device 10 is utilized for generating a recovery clock CLK and retimed data RDATA according to an input data stream DATAIN and a reference clock REF. As shown in FIG. 1, the clock data recovery device 10 includes a phase detector PDET, a frequency detector FDET, a selecting unit SEL, a state machine STA, a charge pump CP, a low-pass filter LPF, a multi-bands voltage-controlled oscillator VCO and a frequency dividing unit DIV. The phase detector PDET is utilized for detecting a phase difference between a data frequency of the input data stream DATAIN and the recovery clock CLK outputted by the multi-bands voltage-controlled oscillator VCO and accordingly generating a phase difference signal S_PD and a phase locking signal DLOCK. The phase detector PDET is also utilized for generating the retimed data RDATA according to the input data stream DATAIN and the recovery clock CLK. The phase detector PDET may include a d-flip-flop and a serial-to-parallel converter. The d-flip-flop is utilized for correcting the data frequency of the input data stream DATAIN. The serial-to-parallel converter then converts the corrected input data stream DATAIN for generating the retimed data RDATA. The frequency detector FDET is utilized for determining a frequency difference between the reference clock REF and a dividing clock DIVCLK generated by the dividing unit DIV, to accordingly generate a frequency difference signal S_FD and a frequency locking signal FLOCK. The selecting unit SEL is utilized for outputting one of the phase difference signal S_PD and the frequency difference signal S_FD to the charge pump CP according to a control signal CON. The charge pump CP is utilized for generating a current signal CC to the low-pass filter LPF according to the signal outputted by the selecting unit SEL. The low-pass filter LPF generates a corresponding locking voltage VC according to the current signal CC. The multi-bands voltage-controlled oscillator VCO generates the recovery clock CLK according to the locking voltage VC. The state machine STA is utilized for outputting the selecting control signal CON to the selecting unit SEL according to the phase locking signal DLOCK and the frequency locking signal FLOCK.

The clock data recovery device 10 first makes the frequency of the recovery clock CLK track that of the reference clock REF. In such a condition, the state machine STA controls the selecting unit SEL to output the frequency difference signal S_FD via adjusting the selecting control signal CON. When the frequency of the recovery clock CLK is close to the reference clock REF, the frequency detector FDET outputs the appropriate frequency locking signal FLOCK, for allowing the state machine STA to control the selecting unit SEL to output the phase difference signal S_PD. Via two-stages locking and the precise reference clock REF, the clock data recovery can avoid mis-lock occurring, and acquire the accurate recovery clock CLK and the re-timed data according to the input data stream DATAIN.

The reference clock REF needs to be optimized and of low jitter for preventing the clock data recovery device 10 from going into mis-lock while performing the locking procedures. Moreover, the input data stream DATAIN is required to include a training pattern when the clock data recovery device 10 begins to work, for accurately acquiring the retimed data RDATA.

SUMMARY OF THE INVENTION

Therefore, the present invention provides a control method and related clock data recovery device capable of generating an accurate recovery clock without requiring a precise reference clock.

As to an aspect, the present invention discloses a control method utilized in a clock data recovery device supporting a plurality of frequency bands, for controlling the clock data recovery device to select an operating frequency band from the plurality of frequency bands and for generating a recovery clock for generating retimed data. The control method includes receiving a serial data stream with a data frequency; making each frequency band of the plurality of frequency bands correspond to a plurality of frequency band groups, wherein each frequency band group comprises at least one frequency band and corresponds to different frequency ranges; selecting a frequency band group from the plurality of frequency band groups as a coarse-tuned frequency band group according to the data frequency and a locking voltage range; and selecting a frequency band from the plurality of frequency bands as the operating frequency band according to the data frequency, the locking voltage range and the coarse-tuned frequency band group, for generating the recovery clock.

As to another aspect, the present invention discloses a clock data recovery device. The clock data recovery device includes a phase detector, for generating a phase detecting signal according to a data frequency of a serial data stream and a recovery frequency of a recovery clock, and for generating retimed data according to the serial data stream and the recovery clock; a charge pump, coupled to the phase detector for generating a current signal according to the phase detecting signal; a low pass filter, coupled to the charge pump for generating a locking voltage according to the current signal; a multi-bands voltage-controlled oscillator, coupled to the low pass filter for operating at an operating frequency band of a plurality of frequency bands according to a band selecting signal and generating the recovery clock according to the locking voltage and the operating frequency band; a voltage range generating unit, for generating a locking voltage range according to a range control signal; a comparing unit, coupled to the voltage range generating unit and the low pass filter for generating a high locking signal according to the highest voltage of the locking voltage range and the locking voltage and generating a low locking signal according to the lowest voltage of the locking voltage range and the locking voltage; and a control module, coupled to the comparing unit, the charge pump, the voltage range generating unit and the multi-bands voltage-controlled oscillator for generating the band selecting signal and the range control signal.

These and other objectives of the present invention will no doubt become obvious to those of ordinary skill in the art after reading the following detailed description of the preferred embodiment that is illustrated in the various figures and drawings.

DETAILED DESCRIPTION

In the following exemplary embodiments, a clock data recovery device automatically adjusts a multi-bands voltage-controlled oscillator VCO according to a locking voltage VC inputted to the multi-bands voltage-controlled oscillator VCO, for controlling the multi-bands voltage-controlled oscillator VCO to work at the optimized frequency band. The present invention is particularly shown and described with respect to at least one exemplary embodiment accompanied by drawings. Words utilized for describing connections between two components such as 'couple' and 'connect' should not be taken as limiting a connection between the two components to be directly coupling or indirectly coupling.

Figure 2:
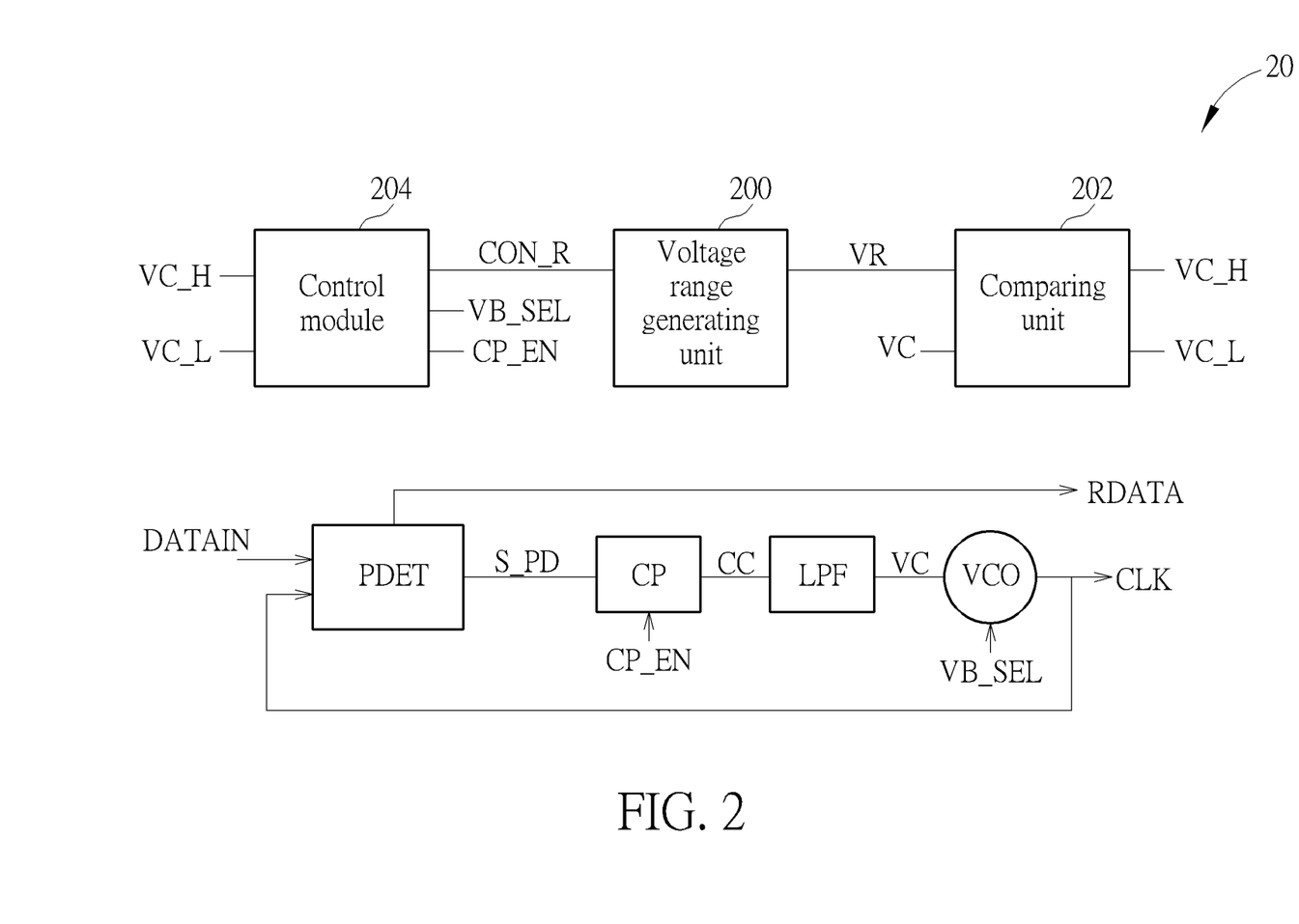
FIG. 2 is a schematic diagram of a clock data recovery device according to an embodiment of the present invention.

Please refer to FIG. 2, which is a schematic diagram of a clock data recovery device 20 according to an embodiment of the present invention. The clock data recovery device 20 is utilized for outputting a recovery clock CLK and a retimed data RDATA according to an input data stream DATAIN (e.g. a serial data stream). As shown in FIG. 2, the clock data recovery device 20 includes a phase detector PDET, a charge pump CP, a low-pass filter LPF, a multi-bands voltage-controlled oscillator VCO, a voltage range generating unit 200, a comparing unit 202 and a control module 204. The phase detector PDET is utilized for generating a phase detecting signal S_PD according to a data frequency DFREQ of the input data stream DATAIN and a recovery frequency CFREQ of the recovery clock CLK. The phase detector PDET is further utilized for generating the retimed data RDATA according to the input data stream DATAIN and the recovery clock CLK. For example, the phase detector PDET may include a D-flip-flop and a serial-to-parallel converter. The D-flip-flop is utilized for correcting the data frequency of the input data stream DATAIN. The serial-to-parallel converter then converts the corrected input data stream DATAIN, for acquiring the retimed data RDATA. The charge pump CP is coupled to the phase detector PDET, for generating a current signal CC according to the phase detecting signal S_PD and a charge pump enable signal CP_EN. The low-pass filter LPF is coupled to the charge pump CP, for generating a locking voltage VC to the multi-bands voltage-controlled oscillator VCO according to the current signal CC. The multi-bands voltage-controlled oscillator VCO is coupled to the low-pass filter LPF, for operating at an operating frequency band VB_W among frequency bands VB_1-VB_n according to a frequency band selecting signal VB_SEL, so as to generate the recovery clock CLK according to the locking voltage VC and the operating frequency band VB_W. The voltage range generating unit is utilized for generating a locking voltage range VR according to a range control signal CON_R. The comparing unit 202 is coupled to the voltage range generating unit 200 and the low pass filter LPF, for outputting a high locking signal VC_H according to locking voltage VC and the maximum voltage of the locking voltage range VR and outputting a low locking signal VC_L according to the locking voltage VC and the minimum voltage of the locking voltage range VR. The control module 204 is coupled to the charge pump CP, the voltage range generating unit 200, the comparing unit 202 and the multi-bands voltage-controlled oscillator VCO, for generating the frequency band selecting signal VB_SEL, the range control signal CON_R and the charge pump enable signal CP_EN according to the locking voltage VC and the locking voltage range VR. As a result, the clock data recovery device 20 selects the most suitable frequency band among the frequency bands VB_1-VB_n as the operating frequency band VB_W according to the locking voltage VC. In other words, the clock data recovery device 20 can generate highly accurate recovery clock CLK and retimed data RDATA without using a low jitter reference clock or a training pattern.

In detail, the frequency bands VB_1-VB_n of the multi-bands voltage-controlled oscillator VCO are firstly classified into frequency band groups VBC_1-VBC_m. Each frequency band group includes at least one frequency band and corresponds to different frequency ranges. The control module 204 randomly selects one of the frequency band groups VBC_1-VBC_m as a coarse-tuned testing frequency band group CTT_VBG and selects a frequency band of the coarse-tuned testing frequency band group CTT_VBG as a coarse-tuned testing frequency band CTT_VB via adjusting the frequency band selecting signal VB_SEL, for controlling the multi-bands voltage-controlled oscillator VCO to operate at the coarse-tuned testing frequency band CTT_VB. Preferably, a frequency range corresponding to the coarse-tuned testing frequency band CTT_VB is a median of frequency ranges corresponding to the frequency bands of the coarse-tuned testing frequency band group CTT_VBG, but is not limited herein.

Next, the control module 204 adjusts the charge pump enable signal CP_EN for allowing the clock data recovery device 20 to begin to operate and to generate the locking voltage VC corresponding to the coarse-tuned testing frequency band CTT_VB. The comparing unit 202 then generates the high locking signal VC_H and the low locking signal VC_L according to the locking voltage VC and the locking voltage range VR, for indicating whether the locking voltage VC locates in the locking voltage range VR. For example, if the locking voltage VC is greater than the maximum voltage of the locking voltage range VR, the comparing unit 202 outputs the high locking signal VC_H with the high logic level for indicating that the locking voltage VC exceeds the locking voltage range VR. If the locking voltage VC is smaller than the minimum voltage of the locking voltage range VR, the comparing unit 202 outputs the low locking signal VC_L with the high logic level for indicating that the locking voltage VC is lower than the locking voltage range VR. If the locking voltage VC locates at the locking voltage range VR, the high locking signal VC_H and the low locking signal VC_L outputted by the comparing unit 202 are both in the low logic level. According to the high locking signal VC_H and the low locking signal VC_L, the comparing unit 202 can determine whether the locking voltage VC exists in the locking voltage range VR and can determine the relationship between the locking voltage VC and the locking voltage range VR. Note that, the comparing unit 202 should perform comparing operations after the locking voltage VC is stable, so as to correctly determine the relationship between the locking voltage VC and the locking voltage range VR.

When the comparing unit indicates that the locking voltage VC locates in the locking voltage range VR, the data frequency DFREQ of the input data stream DATAIN exists in the frequency range of the coarse-tuned testing frequency band group CTT_VBG corresponding to the locking voltage range VR. The control module 204 outputs the coarse-tuned testing frequency band group CTT_VBG as the coarse-tuned frequency band group CT_VBG, for allowing the clock data recovery device 20 to perform subsequent fine-tuned operations. When the comparing unit 202 indicates that the locking voltage VC locates outside of the locking voltage range VR, the control module 204 selects another frequency band group as the coarse-tuned testing frequency band group CTT_VBG according to the high locking signal VC_H and the low locking signal VC_L, for allowing the clock data recovery device 20 to perform the above procedure until the locking voltage VC locates in the locking voltage range VR. For example, if the high locking signal VC_H indicates that the locking voltage VC exceeds the locking voltage range VR, the data frequency DFREQ is higher than the frequency range of the coarse-tuned testing frequency band group CTT_VBG within the locking voltage range VR. The control module 204 selects a frequency band group, the frequency range of which is higher than that of the current coarse-tuned testing frequency band group CTT_VBG, as the next coarse-tuned testing frequency band group CTT_VBG. If the low locking signal VC_L indicates that the locking voltage VC is lower than the locking voltage range VR, the data frequency DFREQ is lower than the frequency range of the coarse-tuned testing frequency band group CTT_VBG within the locking voltage range VR. The control module 204 selects a frequency band group, the frequency range of which is lower than that of the current coarse-tuned testing frequency band group CTT_VBG, as the next coarse-tuned testing frequency band group CTT_VBG. Via the above procedure, the clock data recovery device 20 can quickly search the frequency band group corresponding to the data frequency DFREQ of the input data stream DATAIN and the locking time of the clock data recovery device 20 can be effectively decreased.

After the coarse-tuned frequency band group CT_VBG is determined, the control module 204 selects a frequency band of the coarse-tuned frequency band group CT_VBG as a fine-tuned testing frequency band FTT_VB via adjusting the frequency band selecting signal VB_SEL, for controlling the multi-bands voltage-controlled oscillator VCO to operate at the fine-tuned testing frequency band FTT_VB. The control module 204 then adjusts the charge pump enable signal CP_EN for controlling the clock data recovery device 20 to begin to perform locking and to generate the locking voltage VC corresponding to the fine-tuned testing frequency band FTT_VB. Similarly, the comparing unit 202 generates the high locking signal VC_H and the low locking signal VC_L according to the locking voltage VC and the locking voltage range VR, for indicating whether the locking voltage VC locates in the locking voltage range VR. If the locking voltage VC locates outside of the locking voltage range VR, the control module 204 selects another frequency band as the fine-tuned testing frequency band FTT_VB according to the high locking signal VC_H and the low locking signal VC_L. For example, if the high locking signal VC_H indicates that the locking voltage VC exceeds the locking voltage range VR, the data frequency DFREQ is higher than the frequency range corresponding to the current fine-tuned testing frequency band FTT_VB within the locking voltage range VR. The control module 204 selects the frequency band, the frequency range of which is greater than that of the current fine-tuned testing frequency band FTT_VB, as the next fine-tuned testing frequency band FTT_VB. If the low locking signal VC_L indicates that the locking voltage VC is lower than the locking voltage range VR, the data frequency DFREQ is lower than the frequency range corresponding to the current fine-tuned testing frequency band FTT_VB within the locking voltage range VR. The control module 204 selects the frequency band, the frequency range of which is smaller than that of the current fine-tuned testing frequency band FTT_VB, as the next fine-tuned testing frequency band FTT_VB.

When the comparing unit 202 indicates that the locking voltage VC locates in the locking voltage range VR, the control module 204 outputs the operating frequency band VB_W via determining whether the locking voltage range VR is smaller than or equal to an error threshold TH. If the control module 204 determines the locking voltage range VR is greater than the error threshold TH, the control module 204 adjusts the range control signal CON_R for narrowing the locking voltage range VR and controls the comparing unit 202 to compare the locking voltage VC and the locking voltage range VR. If the locking voltage range VR is smaller than or equal to the error threshold TH, the control module 204 outputs the current fine-tuned testing frequency band FTT_VB as the operating frequency band VB_W. Accordingly, the clock data recovery device 20 can output the recovery clock and the retimed data RDATA with high accuracy.

Please note that, the clock data recovery device 20 utilizes the blind search to select the coarse-tuned testing frequency band CTT_VBG and the fine-tuned testing frequency band FTT_VB in the above embodiments, but is not limited herein. For example, the clock data recovery device 20 may utilize searching algorithms, such as the binary search and linear search, for reducing the search time of the coarse-tuned frequency band CT_VBG and the operating frequency band VB_W.

Figure 3A:
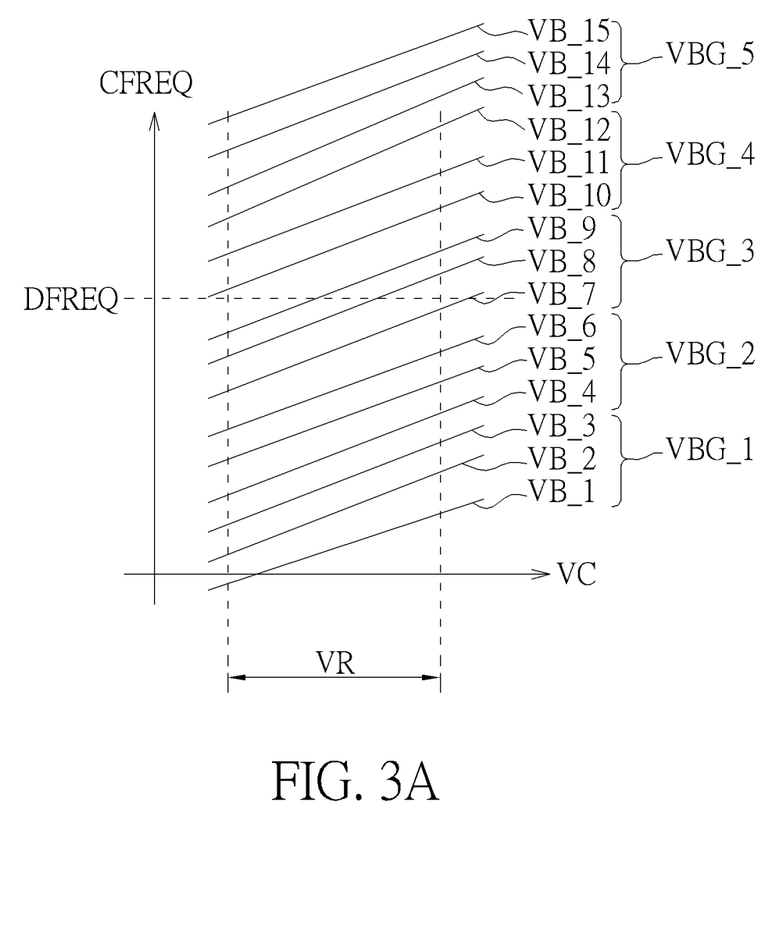
FIG. 3A and FIG. 3B are schematic diagrams of related signals when the clock data recovery device shown in FIG. 2 operates.

Please refer to FIG. 3A, which is a schematic diagram of related signals when the clock data recovery device 20 shown in FIG. 2 operates. As shown in FIG. 3A, the multi-bands voltage-controlled oscillator VCO of the clock data recovery device 20 includes frequency bands VB_1-VC_15. The frequency bands V_1-V_15 are classified into frequency band groups VBG_1-VBG_5. The control module 204 may firstly select the frequency band group VBG_2 as the coarse-tuned testing frequency band group CTT_VBG and may select the frequency band VB_5 as the coarse-tuned testing frequency band CTT_VB. Since the locking voltage VC corresponding to the frequency band VB_5 exceeds the locking range VR, the control module 204 then selects the frequency band group with greater frequency range than the frequency band group VB_2 as the next coarse-tuned testing frequency band group CTT_VBG. In this embodiment, the control module 204 selects the frequency band group VBG_3 as the next coarse-tuned testing frequency band CTTVBG and selects the frequency band VB_8 as the coarse-tuned testing frequency band CTT_VB. Since the locking voltage VC is within the locking voltage range VR while the multi-bands voltage-controlled oscillator VCO operates at the frequency band VB_8, the control module 204 determines the frequency band group VBG_3 as the coarse-tuned frequency band group CT_VBG.

Figure 3B:
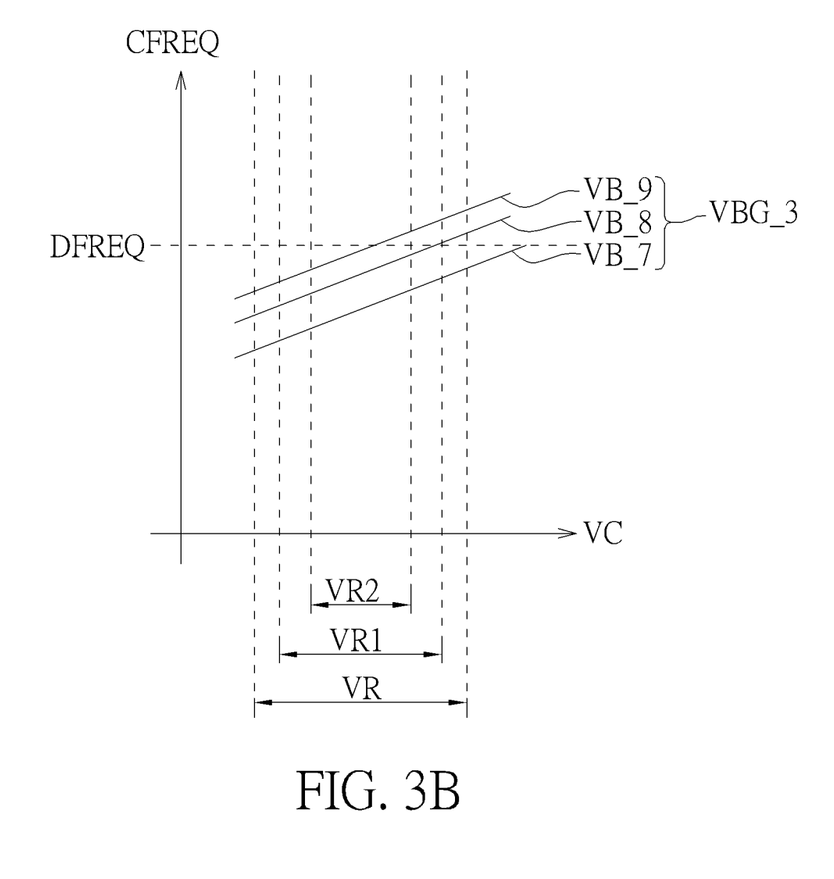

Please refer to FIG. 3B, which is another schematic diagram of related signals when the clock data recovery device 20 shown in FIG. 2 operates. After determining the frequency band VBG_3 as the coarse-tuned frequency band group CT_VBG, the control module 204 may select the frequency band VB_7 as the fine-tuned testing frequency band. as the locking voltage VC corresponding to the frequency band VB_7 is greater than the locking voltage range VR, the control module 204 selects the frequency band VB_8, the frequency range of which is greater than that of the frequency band VB_7, as the fine-tuned testing frequency band FTT_VB via adjusting the frequency band selecting signal VB_SEL. Although the locking voltage VC is within the locking voltage range VR while the multi-bands voltage-controlled oscillator VCO operates at the frequency band VB_8, the locking voltage range VR is greater than the error threshold TH. The control module 204 then narrows the locking voltage range VR to a locking voltage range VR1 via adjusting the range control signal CON_R. Similarly, since the locking voltage VC is greater than the locking voltage range VR1 while the multi-bands voltage-controlled oscillator VCO operates at the frequency band VB_8, the control module 204 selects the frequency band VB_9, the frequency range of which is greater than that of the frequency band VB_8, as the fine-tuned testing frequency band FTT_VB via adjusting the frequency band selecting signal VB_SEL. As the locking voltage range VR1 is still greater than the error threshold TH, the control module 204 narrows the locking voltage range VR1 to a locking voltage range VR2. Finally, the locking voltage VC is within the locking voltage range VR2 and the locking voltage range VR2 is smaller than the error threshold TH. The control module 204 outputs the frequency band VB_9 as the operating frequency band VB_W. The clock data recovery device 20 accordingly outputs the recovery clock CLK and the retimed data RDATA with high accuracy.

Please note that the main spirit of the above embodiments is to first determine a frequency band group corresponding to the input data stream via detecting whether the locking voltage of the multi-bands voltage-controlled oscillator is within a certain locking voltage range, and then gradually narrowing the locking voltage range through comparing the locking voltage range and the locking voltage corresponding to the frequency bands close to the determined frequency band group, so as to acquire the optimized frequency band as the operating frequency band. Without using an accurate reference clock, the clock data recovery device of the above embodiments can operate at the optimized frequency band and can generate the recovery clock and the retimed data with high accuracy. According to different applications, those skilled in the art may accordingly observe appropriate alternations and modifications. For example, the control module 204 may further include a storage unit for storing the operating frequency band VB_W outputted by the control module 204. When the clock data recovery device 20 begins to work, the control module 204 can directly read the operating frequency band VB_W stored in the storage unit without performing locking procedures. The clock data recovery device 20 also can use a reference clock with a considerable frequency error for helping the clock data recovery device 20 to perform a start-up procedure. Then, the clock data recovery device 20 can perform the above locking procedures for acquiring the optimized operating frequency band VB_W.

Figure 4:
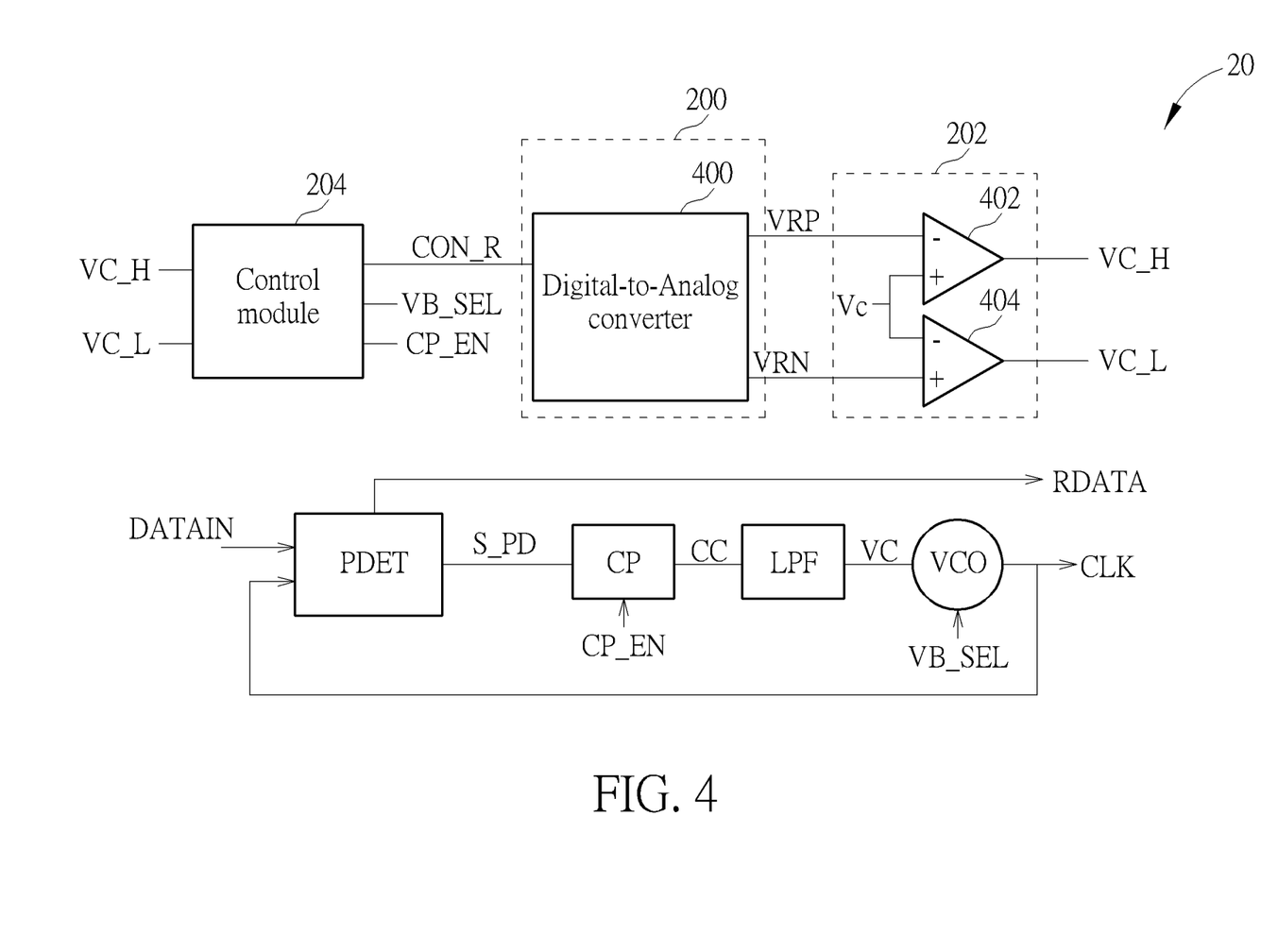
FIG. 4 is a schematic diagram of an exemplary embodiment of the clock data recovery device shown in FIG. 2.

Please refer to FIG. 4, which is a schematic diagram of another exemplary embodiment of the clock data recovery device 20 shown in FIG. 2. In this embodiment, the voltage range generating unit 200 is realized by a digital-to-analog converter 400 and the comparing unit 202 is realized by comparators 402, 404. The digital-to-analog converter 400 is utilized for generating a maximum voltage VRP of the locking voltage range VR and a minimum voltage VRN of the locking voltage range VR according to the range control signal CON_R. The comparator 402 is utilized for comparing the locking voltage VC and the maximum voltage VRP, to generate the high locking signal VC_H. The comparator 404 is utilized for comparing the locking voltage VC and the minimum voltage VRN, to generate the low locking signal VC_L. The high locking signal VC_H and the low locking signal VC_L can be used to indicate whether the locking voltage VC is within the locking range VR. Please note that the combination of the voltage range generating unit 200 and the comparing unit 202 also can be realized by an analog-to-digital converter in other embodiments, and is not limited herein. The operating method of the analog-to-digital converter should be well known to those skilled in the art, and is not narrated herein for brevity.

Figure 5:
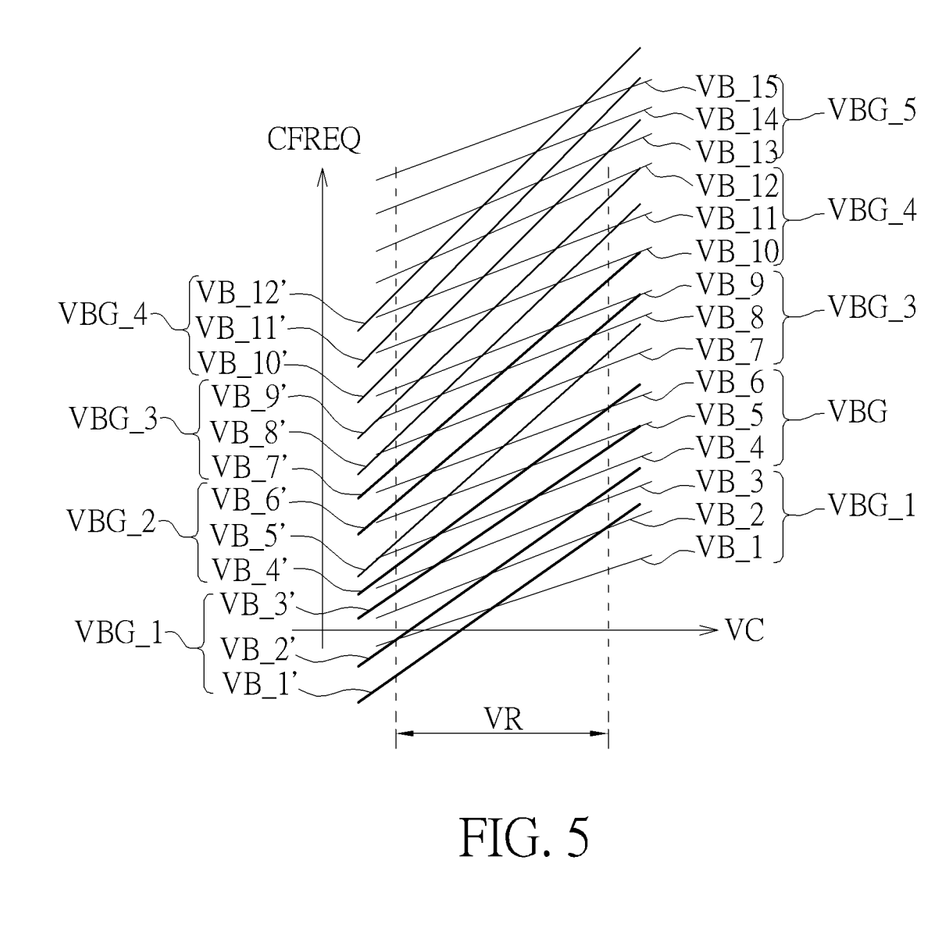
FIG. 5 is another schematic diagram of related signals when the clock data recovery device shown in FIG. 2 operates.

The locking procedures of the clock data recovery device 20 can be accelerated via adjusting bandwidth of the clock data recovery device 20. Please refer to FIG. 5, which is another schematic diagram of related signals when the clock data recovery device 20 shown in FIG. 2 operates. As shown in FIG. 5, the multi-bands voltage-controlled oscillator VOC of the clock data recovery device 20 comprises frequency bands VB_1-VB_15 and the frequency bands VB_1-VB_15 are classified into frequency band groups VBG_1-VBG_5. When the clock data recovery device 20 begins operating, the bandwidth of the clock data recovery device 20 is increased by adjusting the charge current of the charge pump CP, the coefficients of the low-pass filter LPF, or the gain of the multi-bands voltage-controlled oscillator VCO, for broadening the frequency rages corresponding to the frequency bands VB_1-VB_15. After increasing the bandwidth of the clock data recovery device 20, the frequency bands VB_1-VB_15 become VB_1'-VB_15'. As can be seen from FIG. 5, the frequency range corresponding to the frequency band VB_1'-VB_12' (i.e. frequency band VBG_1-VBG_4) is greater than that corresponding to the frequency bands VB_1-VB_15 (i.e. VBG_1-VBG_5). After increasing the frequency ranges corresponding to the frequency bands VB_1-VB_15 (i.e. increasing the bandwidth of the clock data recovery device 20), the clock data recovery device 20 can acquire the frequency range corresponding to the data frequency DFREQ of the input data stream DATAIN by testing fewer frequency bands and frequency band groups. Therefore, the time of searching an operating frequency band VB_W can be decreased.

Figure 6:
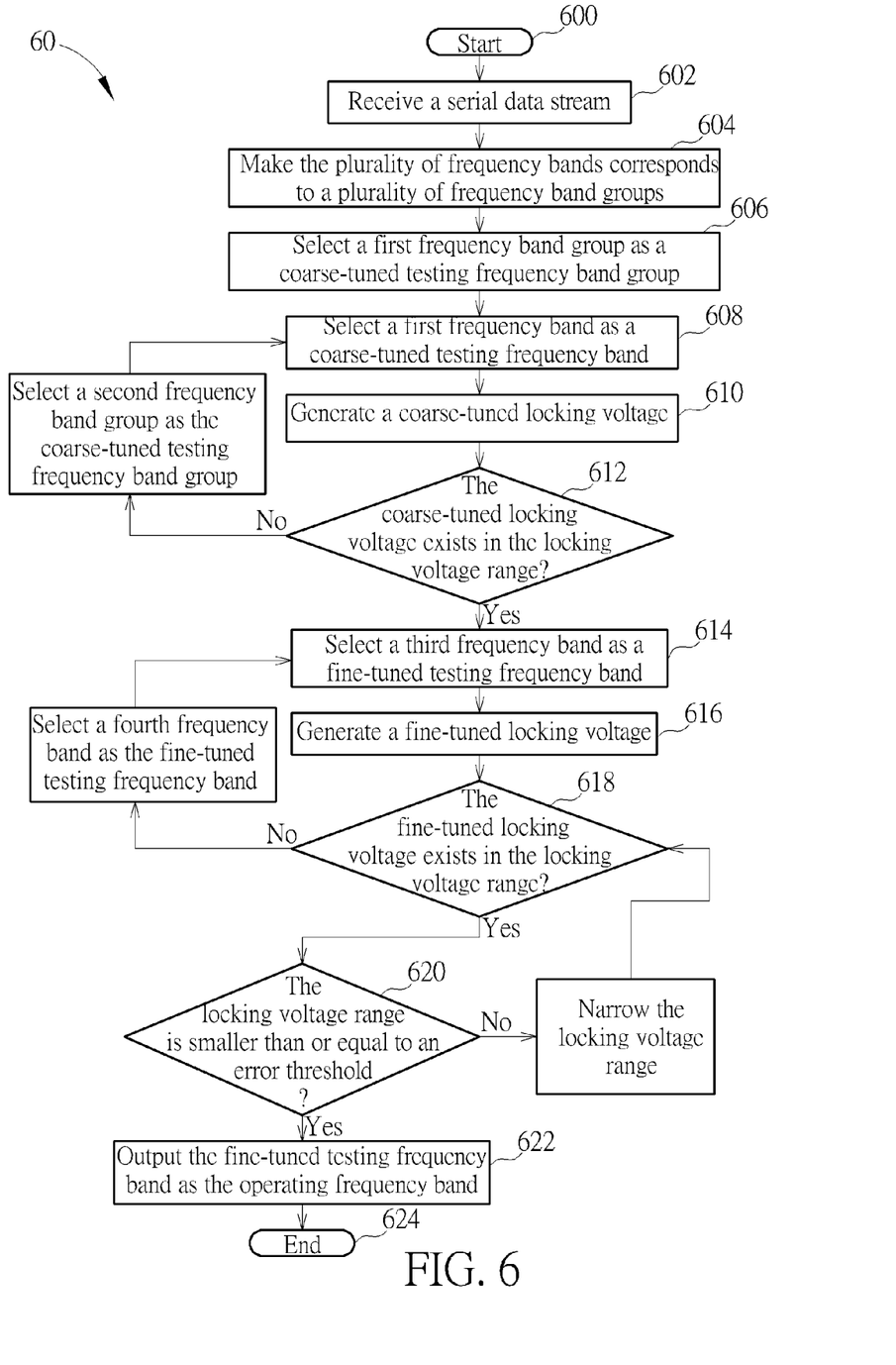
FIG. 6 is a flow chart of a control method according to an embodiment of the present invention.

The operating methods of the above mentioned clock data recovery device can be summarized into a control method 60. Please refer to FIG. 6, which is a flow diagram of the control method 60 according to an embodiment of the present invention. The control method 60 is utilized in a clock data recovery device supporting a plurality of frequency bands for controlling the clock data recovery device to select an operating frequency band among the plurality of frequency bands. The control method 60 comprises:

Step 600: Start.

Step 602: Receive a serial data stream with a data frequency.

Step 604: Make each frequency band of the plurality of frequency bands correspond to a plurality of frequency band groups, wherein each frequency band group comprises at least one frequency band and corresponds to different frequency ranges.

Step 606: Select a first frequency band group from the plurality of frequency band groups as a coarse-tuned testing frequency band group.

Step 608: Select a first frequency band from the coarse-tuned testing frequency band group as a coarse-tuned testing frequency band.

Step 610: Generate a coarse-tuned locking voltage according to a coarse-tuned frequency testing band and the data frequency.

Step 612: Determine whether the coarse-tuned locking voltage exists in the locking voltage range. When the coarse-tuned locking voltage exists in the locking voltage range, perform step 614; otherwise, select a second frequency band group from the plurality of frequency band groups as the coarse-tuned testing frequency band group according to the coarse-tuned locking voltage and the locking voltage range and perform step 508.

Step 614: Select a third frequency band from the coarse-tuned frequency band group as a fine-tuned testing frequency band.

Step 616: Generate a fine-tuned locking voltage according to the fine-tuned testing frequency band and the data frequency.

Step 618: Determine whether the fine-tuned locking voltage exists in the locking voltage range. When the fine-tuned locking voltage exists in the locking voltage range, perform step 620; otherwise, select a fourth frequency band according to the fine-tuned locking voltage and the locking voltage range as the fine-tuned testing frequency band and perform step 616.

Step 620: Determine whether the locking voltage range is smaller than or equal to an error threshold. When the locking voltage range is smaller than or equal to the error threshold, perform step 522; otherwise narrow the locking voltage range and perform step 618.

Step 622: Output the fine-tuned testing frequency band as the operating frequency band.

Step 624: End.

According to the control method 60, the clock data recovery device does not need an accurate reference clock for operating at the optimized frequency band corresponding to the data frequency of the serial data stream. Please note that, the methods of selecting a second frequency band group from the plurality of frequency band groups and selecting a fourth frequency band according to the fine-tuned locking voltage and the locking voltage range can be blind search, binary search, linear search, etc, but are not limited herein.

To sum up, compared with the prior art which requires an accurate reference clock or training patterns for performing locking, the control method and the clock data recovery device disclosed in the above embodiments do not need an accurate reference clock for generating the precise recovery clock and the correct retimed data. Accordingly, the manufacturing costs of implementing the clock data recovery device can be effectively reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A control method utilized in a clock data recovery device supporting a plurality of frequency bands, for controlling the clock data recovery device to select an operating frequency band from the plurality of frequency bands and for generating a recovery clock for generating retimed data, the control method comprising:

receiving a serial data stream with a data frequency;

making each frequency band of the plurality of frequency bands correspond to a plurality of frequency band groups, wherein each frequency band group comprises at least one frequency band and corresponds to different frequency ranges;

selecting a frequency band group from the plurality of frequency band groups as a coarse-tuned frequency band group according to the data frequency and a locking voltage range; and selecting a frequency band from the plurality of frequency bands as the operating frequency band according to the data frequency, the locking voltage range and the coarse-tuned frequency band group, for generating the recovery clock;

wherein the step of selecting the frequency band group from the plurality of frequency band groups as the coarse-tuned frequency band group according to the data frequency and the locking voltage range comprises:

selecting a first frequency band group from the plurality of frequency band groups as a coarse-tuned testing frequency band group;

selecting a first frequency band from the coarse-tuned testing frequency band group as a coarse-tuned testing frequency band;

generating a coarse-tuned locking voltage according to coarse-tuned frequency testing band and the data frequency; and determining whether the coarse-tuned locking voltage exists in the locking voltage range, for generating the coarse-tuned frequency band.

2. The control method of claim 1, wherein the frequency range of the first frequency band is a median of at least one frequency range of frequency band of the coarse tuned testing frequency band group.

3. The control method of claim 1, wherein the step of determining whether the coarse-tuned locking voltage exists in the locking voltage range for generating the coarse-tuned frequency band comprises:

generating a high locking signal according to the coarse-tuned locking voltage and the highest voltage of the locking voltage range;

generating a low locking signal according to the coarse-tuned locking voltage and the lowest voltage of the locking voltage range; and determining whether the coarse-tuned locking voltage exists in the locking voltage range, for generating the coarse-tuned frequency band.

4. The control method of claim 1, wherein the step of determining whether the coarse-tuned locking voltage exists in the locking voltage range for generating the coarse-tuned frequency band comprises:

outputting the coarse-tuned testing frequency band group as the coarse-tuned frequency band group when the coarse-tuned locking voltage exists in the locking voltage range.

5. The control method of claim 1, wherein the step of determining whether the coarse-tuned locking voltage exists in the locking voltage range for generating the coarse-tuned frequency band comprises:

selecting a second frequency band group from the plurality of frequency band groups as the coarse-tuned testing frequency band group according to the coarse-tuned locking voltage and the locking voltage range when the coarse-tuned locking voltage does not exist in the locking voltage range.

6. The control method of claim 5, wherein the frequency range of the second frequency band group is higher than the frequency range of the first frequency band group when the coarse-tuned locking range is greater than the locking voltage range.

7. The control method of claim 5, wherein the frequency range of the second frequency band group is lower than the frequency range of the first frequency band group when the coarse-tuned locking range is smaller than the locking voltage range.

8. The control method of claim 5, wherein the step of selecting the second frequency band group from the plurality of frequency band groups as the coarse-tuned testing frequency band group according to the coarse-tuned locking voltage comprises:

utilizing a binary search for selecting the second frequency band group from the plurality of frequency band groups as the coarse-tuned testing frequency band group according to the coarse-tuned locking voltage.

9. The control method of claim 5, wherein the step of selecting the second frequency band group from the plurality of frequency band groups as the coarse-tuned testing frequency band group according to the coarse-tuned locking voltage comprises:

utilizing a linear search for selecting the second frequency band group from the plurality of frequency band groups as the coarse-tuned testing frequency band group according to the coarse-tuned locking voltage.

10. The control method of claim 5, wherein the step of selecting the second frequency band group from the plurality of frequency band groups as the coarse-tuned testing frequency band group according to the coarse-tuned locking voltage comprises:

utilizing a blind search for selecting the second frequency band group from the plurality of frequency band groups as the coarse-tuned testing frequency band group according to the coarse-tuned locking voltage.

11. The control method of claim 1, wherein the step of selecting the frequency band from the plurality of frequency bands as the operating frequency band according to the data frequency, the locking voltage range and the coarse-tuned frequency band group for generating the recovery clock comprises:

selecting a first frequency band from the coarse-tuned frequency band group as a fine-tuned testing frequency band;

generating a fine-tuned locking voltage according to the fine-tuned testing frequency band and the data frequency;

determining whether the fine-tuned locking voltage exists in the locking voltage range for outputting the operating frequency band; and generating the recovery clock according to the operating frequency band.

12. The control method of claim 11, wherein the step of determining whether the fine-tuned locking voltage exists in the locking voltage range for outputting the operating frequency band comprises:

determining whether the locking voltage range is smaller than or equal to an error threshold when the fine-tuned locking voltage exists in the locking voltage range, for outputting the operating frequency band.

13. The control method of claim 12, wherein the step of determining whether the locking voltage range is smaller than or equal to the error threshold for outputting the operating frequency band comprises:

outputting the fine-tuned testing frequency band as the operating frequency band when the locking voltage range is smaller than or equal to the error threshold.

14. The control method of claim 12, wherein the step of determining the locking voltage range equals the error threshold for outputting the operating frequency band comprises:

narrowing the locking voltage range when the locking voltage range is greater than the error threshold.

15. The control method of claim 11, wherein the step of determining whether the fine-tuned locking voltage exists in the locking voltage range for outputting the operating frequency band comprises:

selecting a second frequency band according to the fine-tuned locking voltage and the locking voltage range as the fine-tuned testing frequency band when the fine-tuned locking voltage does not exist in the locking voltage range.

16. The control method of claim 15, wherein the frequency range of the second frequency band is higher than the frequency range of the first frequency band when the fine-tuned locking voltage is greater than the locking voltage range.

17. The control method of claim 15, wherein the frequency range of the second frequency band is lower than the frequency range of the first frequency band when the fine-tuned locking voltage is smaller than the locking voltage range.

18. The control method of claim 1, wherein the step of selecting the frequency band group from the plurality of frequency band groups as a coarse-tuned frequency band group according to the data frequency and the locking voltage range further comprises:

adjusting the frequency range corresponding to each frequency band.

19. The control method of claim 18, wherein the step of adjusting the frequency range corresponding to each frequency band comprises:

adjusting the frequency range corresponding to each frequency band via changing at least one of a charge current of a charge pump, a bandwidth of a low pass filter and a gain of a voltage-controlled oscillator.

20. A clock data recovery device, comprising:

a phase detector, for generating a phase detecting signal according to a data frequency of a serial data stream and a recovery frequency of a recovery clock and for generating retimed data according to the serial data stream and the recovery clock;

a charge pump, coupled to the phase detector for generating a current signal according to the phase detecting signal;

a low pass filter, coupled to the charge pump for generating a locking voltage according to the current signal;

a multi-bands voltage-controlled oscillator, coupled to the low pass filter for operating at an operating frequency band of a plurality of frequency bands according to a band selecting signal and generating the recovery clock according to the locking voltage and the operating frequency band;

a voltage range generating unit, for generating a locking voltage range according to a range control signal;

a comparing unit, coupled to the voltage range generating unit and the low pass filter for generating a high locking signal according to the highest voltage of the locking voltage range and the locking voltage and generating a low locking signal according to the lowest voltage of the locking voltage range and the locking voltage; and a control module, coupled to the comparing unit, the charge pump, the voltage range generating unit and the multi-bands voltage-controlled oscillator for generating the band selecting signal and the range control signal;

wherein the control module makes each frequency band of the plurality of frequency bands corresponding to a plurality of frequency band groups, wherein each frequency band group includes at least one frequency band and corresponds to different frequency ranges; selects a frequency band group from the plurality of frequency band groups as a coarse-tuned frequency band group according to the data frequency and a locking voltage range; and selects a frequency band from the plurality of frequency bands as the operating frequency band according to the data frequency, the locking voltage range and the coarse-tuned frequency band group, for generating the recovery clock.

21. The clock data recovery device of claim 20, wherein the voltage range generating unit is a digital-to-analog converter.

22. The clock data recovery device of claim 20, wherein a combination of the voltage range generating unit and the comparing unit is an analog-to-digital converter.

23. The clock data recovery device of claim 20, wherein the control module selects a first frequency band group from the plurality of frequency band groups as a coarse-tuned testing frequency band group; selects a first frequency band from the coarse-tuned testing frequency band group as a coarse-tuned testing frequency band; generates a coarse-tuned locking voltage according to coarse-tuned frequency testing band and the data frequency; and determines whether the coarse-tuned locking voltage exists in the locking voltage range, for generating the coarse-tuned frequency band.

24. The clock data recovery device of claim 23, wherein the frequency range of the first frequency band is a median of at least one frequency range of the frequency band of the coarse tuned testing frequency band group.

25. The clock data recovery device of claim 23, wherein the control module outputs the coarse-tuned testing frequency band group as the coarse-tuned frequency band group when the coarse-tuned locking voltage exists in the locking voltage range.

26. The clock data recovery device of claim 23, wherein the control module selects a second frequency band group from the plurality of frequency band groups as the coarse-tuned testing frequency band group according to the coarse-tuned locking voltage and the locking voltage range when the coarse-tuned locking voltage does not exist in the locking voltage range.

27. The clock data recovery device of claim 26, wherein the frequency range of the second frequency band group is higher than the frequency range of the first frequency band group when the coarse-tuned locking range is greater than the locking voltage range.

28. The clock data recovery device of claim 26, wherein the frequency range of the second frequency band group is lower than the frequency range of the first frequency band group when the coarse-tuned locking range is smaller than the locking voltage range.

29. The clock data recovery device of claim 26, wherein the control module utilizes a binary search for selecting the second frequency band group from the plurality of frequency band groups as the coarse-tuned testing frequency band group according to the coarse-tuned locking voltage.

30. The clock data recovery device of claim 26, wherein the control module utilizes a linear search for selecting the second frequency band group from the plurality of frequency band groups as the coarse-tuned testing frequency band group according to the coarse-tuned locking voltage.

31. The clock data recovery device of claim 26, wherein the control module utilizes a blind search for selecting the second frequency band group from the plurality of frequency band groups as the coarse-tuned testing frequency band group according to the coarse-tuned locking voltage.

32. The clock data recovery device of claim 23, wherein the control module selects a first frequency band from the coarse-tuned frequency band group as a fine-tuned testing frequency band; generates a fine-tuned locking voltage according to the fine-tuned testing frequency band and the data frequency; determines whether the fine-tuned locking voltage exists in the locking voltage range for outputting the operating frequency band; and generates the recovery clock according to the operating frequency band.

33. The clock data recovery device of claim 32, wherein the control module determines whether the locking voltage range is smaller than or equal to an error threshold when the fine-tuned locking voltage exists in the locking voltage range, for outputting the operating frequency band.

34. The clock data recovery device of claim 33, wherein the control module outputs the fine-tuned testing frequency band as the operating frequency band when the locking voltage range is smaller than or equal to the error threshold.

35. The clock data recovery device of claim 33, wherein the control module narrows the locking voltage range when the locking voltage range is greater than the error threshold.

36. The clock data recovery device of claim 32, wherein the control module selects a second frequency band according to the fine-tuned locking voltage and the locking voltage range as the fine-tuned testing frequency band when the fine-tuned locking voltage does not exist in the locking voltage range.

37. The clock data recovery device of claim 36, wherein the frequency range of the second frequency band is higher than the frequency range of the first frequency band when the fine-tuned locking voltage is greater than the locking voltage range.

38. The clock data recovery device of claim 36, wherein the frequency range of the second frequency band is lower than the frequency range of the first frequency band when the fine-tuned locking voltage is smaller than the locking voltage range.

39. The clock data recovery device of claim 36, wherein the control module further outputs a bandwidth control signal for adjusting the frequency range corresponding to each frequency band.

40. The clock data recovery device of claim 39, wherein the control module further outputs the bandwidth control signal to at least one of the charge pump, the low-pass filter and the multi-bands voltage-controlled oscillator for adjusting the frequency range corresponding to each frequency band.

* * * * *